United States Patent [19]

Okamoto et al.

[11] 4,056,165

[45] Nov. 1, 1977

[54] SOUND REPRODUCING APPARATUS IN THE INSIDE OF A CAR

[75] Inventors: Kintaro Okamoto, Hachioji; Hirokatu Kudo, Wako; Soichi Ishijimi, Tokyo; Etsuro Kadoiri, Tokyo; Hiroshi Soma, Tokyo; Hiroyuki Suzuki, Tokyo, all of Japan

[73] Assignees: Honda Giken Kogyo Kabushiki Kaisha; Pioneer Electronic Corporation, both of Tokyo, Japan

[21] Appl. No.: 626,005

[22] Filed: Oct. 28, 1975

[30] Foreign Application Priority Data

| | | |
|---|---|---|
| Oct. 28, 1974 | Japan | 49-124055 |
| Oct. 28, 1974 | Japan | 49-130149 |
| Oct. 28, 1974 | Japan | 49-103150 |

[51] Int. Cl.$^2$ .............................................. H05K 10/00

[52] U.S. Cl. ................................ 181/141; 179/1 VE; 181/150

[58] Field of Search ............ 179/1 E, 1 VE; 181/141, 181/148-156, 171; 325/312

[56] References Cited

U.S. PATENT DOCUMENTS

| | | | |
|---|---|---|---|
| 1,577,911 | 3/1926 | Koch et al. | 179/1 VE |
| 1,844,802 | 2/1932 | Seabert | 181/151 X |
| 1,905,215 | 4/1933 | Cadieax | 179/1 VE |
| 1,930,577 | 10/1933 | Atkinson | 181/148 X |
| 2,165,637 | 7/1939 | Little | 325/312 |

*Primary Examiner*—Lawrence R. Franklin
*Attorney, Agent, or Firm*—Sughrue, Rothwell, Mion, Zinn and Macpeak

[57] ABSTRACT

A speaker assembly in an automobile located substantially at the intersection of an inside side panel and the ceiling of the automobile. The speaker unit is fixed on a baffle plate and the combination is bolted by means of a fixture to the upper part of said side panel. A packing material positioned on a part of the periphery of the baffle plate forms a tight seal with the inside ceiling material of the automobile.

4 Claims, 5 Drawing Figures

FIG. 1
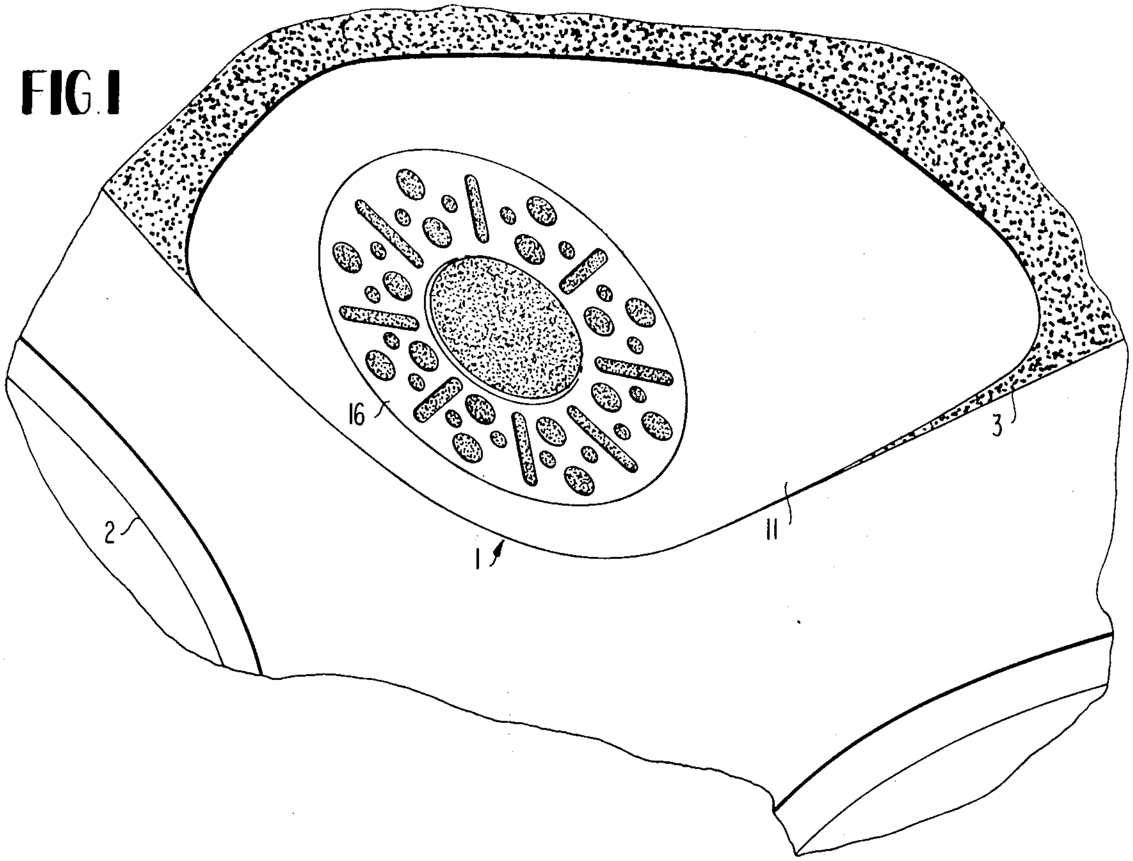
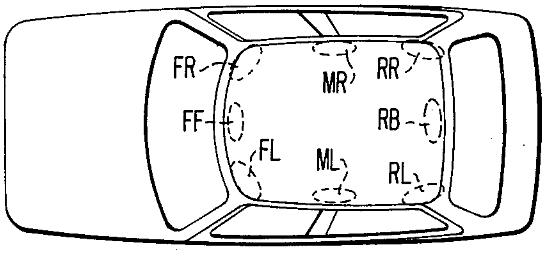
FIG. 2a
FIG. 2b
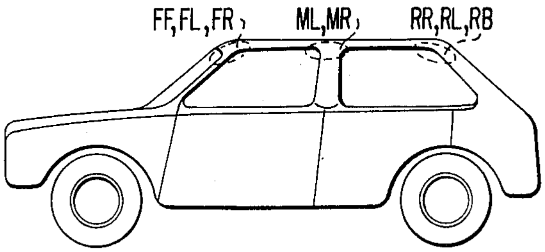

SOUND REPRODUCING APPARATUS IN THE INSIDE OF A CAR

BACKGROUND OF THE INVENTION

Field of the Invention

This invention relates to a sound reproducing apparatus installed in the inside of a car.

In providing a sound reproducing apparatus in a car, it is necessary to suitably locate speakers at selected positions so as to provide the optimum acoustic effects without being in the way of passengers entering and leaving the car. In addition, safety should be secured in case of accidents. In view of the foregoing points, speakers have usually been installed in the doors on both sides in spite of some losses in acoustic effects, mounted on the shelf in front of the rear window or, some time, even installed under the seats. While the ceiling portion of a car would be ideal for installing speakers from the standpoint of acoustic effects and safety, such installations have not been put in practice, because the ceiling portion generally consists of soft material such as synthetic leather and the like which makes it difficult to firmly set the speakers.

SUMMARY OF THE INVENTION

The primary object of this invention is to provide a sound reproducing apparatus in a car that can satisfy the foregoing requirements for speaker mounting positions and for speaker setting by locating the speakers in the boundary portions between inside panels forming a part of the side wall of the inside of a car and the ceiling material.

The secondary object of this invention is to provide a sound reproducing apparatus for use in the inside of a car which can be set firmly to predetermined positions with ease by utilizing the upper end of inside panels forming a part of the side walls of the inside of a car.

DESCRIPTION OF THE ACCOMPANYING DRAWINGS

FIG. 1 is a perspective view illustrating the location of a speaker assembly in one embodiment of this invention;

FIG. 2 is a plan view of a car to which speaker assemblies according to this invention are installed;

FIG. *2b* is a side view of a car shown in FIG. *2a;*

Figure 3:
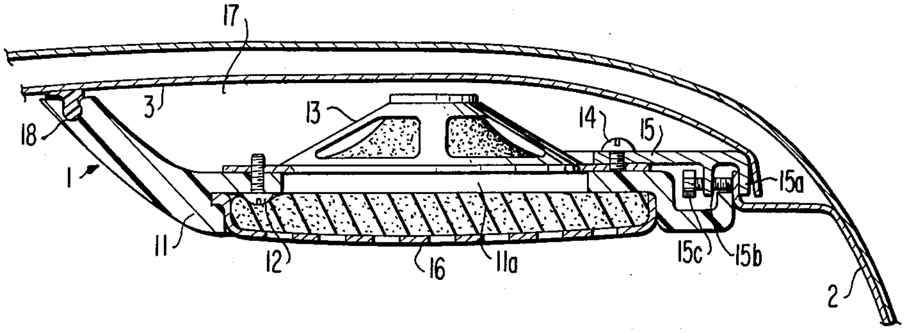

FIG. 3 is a vertical section of a speaker unit and a fixture therefor; and

Figure 4:
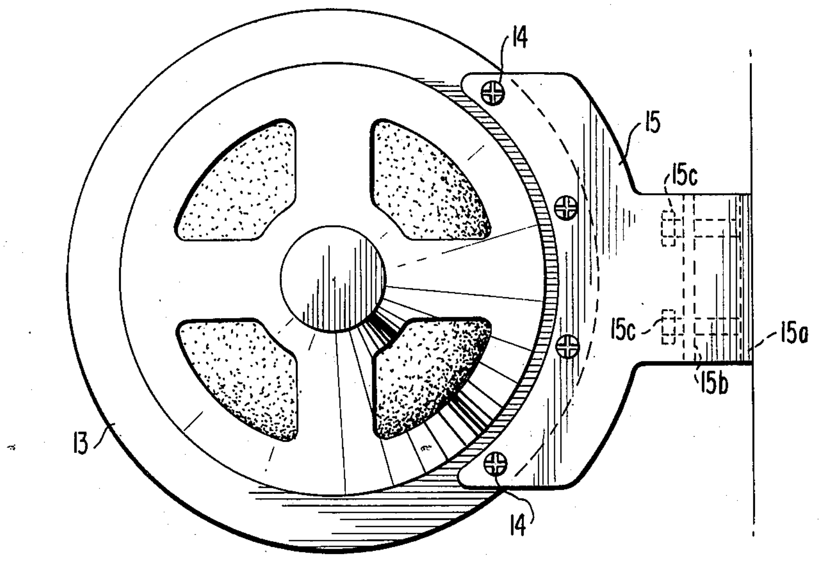

FIG. 4 is a plan view of the speaker assembly shown in FIG. 3.

DESCRIPTION OF THE PREFERRED EMBODIMENT

This invention is to be described specifically by way of a preferred embodiment thereof referring to the accompanying drawings. FIG. 1 shows the installation of a speaker assembly 1, which is a part of a sound reproducing apparatus, in the inside of a car. The speaker assembly 1 is located on the boundary between an inside panel 2, forming a part of the side wall of the inside of the car, and seat material 3, such as synthetic leather or the like, that constitutes the surface of the ceiling. While in the embodiment illustrated in FIG. 1, a speaker assembly 1 is shown to be located in one of the corners (represented as FR, FL, RR,RL in FIG. 2) of a ceiling surface, having approximately a rectangular shape, the speaker assembly can be located also at an intermediate position between adjacent corners (such as at FF, RB, MR, ML or the like in FIG. 2). The number of speaker assemblies installed can be any number as desired, but should at least be the number corresponding to the number of channels of the sound reproducing apparatus. Preferably, one is provided at each of the left and right parts of the ceiling for the two-channel arrangement, and at each of the four corners for a four-channel arrangement.

A speaker assembly 1 comprises, for example as shown in FIG. 3, a speaker unit 13 secured to a baffle plate 11 by means of a bolt 12, a fixture 15, fixed to said speaker unit 13 by means of a bolt 14, a grille plate 16 having sound perforations and fixed to the opening of the baffle plate 11, and a packing 18 for providing an air tight seal between the baffle plate 11 and the seat material 3. A part of the fixture 15 extends in parallel with the opening plane of the speaker unit 13 and forms, at its extreme end, a bent portion **15*a* that rests on the back of the inside panel 2. Another bent portion 15*b* is provided as shown. A bolt 15*c* is threaded through bent portion 15*b*, the front side of panel 2, and into bent portion 15*a* to secure the fixture 15 as shown. The fixture 15 is thus retained at a predetermined position to the inside panel 2 and thereby the speaker unit 13 and the baffle plate 11 are held under the seat material 3 extending to the upper end of the inside panel 2.**

While held to its predetermined position, the baffle plate 11 forms a back chamber of a predetermined capacity in cooperation with the seat material 3 to thereby keep the acoustic waves emitted from the back of the speaker unit 13 from propagating forward of said unit. Reference numeral 16 represents a grille having sound perforations and is provided so as to close the opening **11*a* of the baffle plate 11, and numeral 18 denotes a packing for providing an air tight seal between the baffle plate 11 and the seat material 3. The packing 18 has a tubular configuration preferably made of highly elastic synthetic resin such as polypropylene. A part of said tubular packing is contained in and a held by a Ω-shaped recess formed along the peripheral portion of the baffle plate 11 and the other part of said packing contacts the surface of the seat material 3.**

The foregoing retention of the packing 18 by way of engagement into the Ω-shaped recess in the periphery of the baffle plate 11 is particularly effective for packing materials such as polypropylene, which are not easily held by adhesives.

According to this invention, as described above, the speaker assemblies 1 are located in the boundary portions between the inside panels 2 and the seat material 3 and fixed to said inside panels 2. This enables one to firmly mount the speaker assemblies to predetermined positions. The mounting operation is facilitated because it can be done by merely effecting clamping by means of the bolts **15*c*. In addition, since the inside panels 2 and the seat material 3 are respectively present on planes which intersect with each other at approximately a right angle and the boundary portions between them generally form so called dead spaces, the installation of speakers there does not hinder the passengers from sitting in the car or getting in and out of the car. Further, the location of the speaker assemblies 1 at the intersections of two planes will assist the enforcement of the reproduced sound, in particular, in the lower frequency areas and, therefore, provide advantages for obtaining satisfactory acoustic characteristics. Further, since the back chamber 17 is formed between the baffle plate 11** and side wall of the car, the sound reproducing apparatus can be constructed less thick as compared with the conventional cabinets that incorporate speaker units therein. Further, interior materials are not required to be cut off as in the case of mounting the speakers to the doors.

What is claimed is:

1. A sound reproducing apparatus in the inside of a car comprising speaker assemblies located in boundary portions between inside panels forming a part of the side wall of the inside of the car and ceiling material extending to the upper end of said inside panels, each of said speaker assemblies comprising a speaker unit fixed to a baffle plate, and a fixture attaching said speaker unit and said baffle plate to the upper end of said inside panel so as to form back chambers of predetermined capacity between said baffle and the ceiling of said car, said fixture having a first bent portion that rests on the back of the upper end of said inside panel and a second bent portion, and a bolt fastening the upper end of said inside panel between said first and second bent portions.

2. A sound reproducing apparatus in the inside of a car as claimed in claim 1, wherein packing means are provided at least in a part of the periphery of said baffle plates in order to provide improved air tight seals between said baffle plates and said ceiling.

3. A sound reproducing apparatus in the inside of a car as claimed in claim 2, wherein a Ω-shaped recess is provided along the periphery of each of said baffle plates for containing a part of said packing means.

4. A sound reproducing apparatus in the inside of a car as claimed in claim 2, wherein said packing means consists of highly elastic synthetic resin.

* * * * *